US009048129B2

(12) United States Patent
Liu

(10) Patent No.: US 9,048,129 B2
(45) Date of Patent: Jun. 2, 2015

(54) METHOD FOR FORMING FULLY RELAXED SILICON GERMANIUM ON SILICON

(75) Inventor: Jinping Liu, Hopewell Junction, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 78 days.

(21) Appl. No.: 13/115,684

(22) Filed: May 25, 2011

(65) Prior Publication Data

US 2012/0299155 A1 Nov. 29, 2012

(51) Int. Cl.
*H01L 29/10* (2006.01)
*H01L 21/02* (2006.01)

(52) U.S. Cl.
CPC ....... *H01L 29/1054* (2013.01); *H01L 21/02532* (2013.01); *H01L 21/02573* (2013.01); *H01L 21/02664* (2013.01)

(58) Field of Classification Search
CPC ...................... H01L 29/1054; H01L 21/02532
USPC ............................ 438/938; 257/18, E29.193
See application file for complete search history.

(56) References Cited

U.S. PATENT DOCUMENTS

2008/0079033 A1* 4/2008 Waite et al. .................. 257/255

* cited by examiner

*Primary Examiner* — Amar Movva
(74) *Attorney, Agent, or Firm* — Ditthavong & Steiner, P.C.

(57) ABSTRACT

Semiconductor devices are formed with a thin layer of fully strain relaxed epitaxial silicon germanium on a substrate. Embodiments include forming a silicon germanium (SiGe) epitaxial layer on a semiconductor substrate, implanting a dopant into the SiGe epitaxial layer, and annealing the implanted SiGe epitaxial layer.

14 Claims, 4 Drawing Sheets

METHOD FOR FORMING FULLY RELAXED SILICON GERMANIUM ON SILICON

TECHNICAL FIELD

The present disclosure relates to a method and apparatus for forming a relaxed silicon germanium (SiGe) epitaxial layer on a semiconductor substrate. The present disclosure is particularly applicable to forming a SiGe epitaxial layer on a silicon substrate with an atomic percent of Ge up to near 100%.

BACKGROUND

Fully strain relaxed epitaxial SiGe on silicon (Si) has numerous potential applications for electrical and opto-electrical devices. For practical applications, the epitaxial layer must have a high degree of strain relaxation, a low threading dislocation density, as well as a smooth surface. In addition, the SiGe layer thickness must be minimized, because as SiGe layer thickness increases, production costs rise and significant technological issues occur, such as poor thermal conductivity associated with the SiGe. These requirements are often self-contradictory according to experimental results and theoretical modeling. For example, both experimental results and theoretical models demonstrate that the strain relaxation degree for SiGe on Si depends on SiGe layer thickness—the thicker the layer, the higher the strain relaxation degree. A high degree of strain relaxation (on the order of 90%) is expected only for very thick films (e.g., 2 micrometers for SiGe with 20% Ge), but is not practical in terms of cost. Similarly, the threading dislocation density (TDD) is shown as a function of the SiGe film thickness, whereby TDD decreases with increasing epitaxial layer thickness. As a result, it is a challenge to manufacture thin SiGe (less than 200 nm) on Si with a high degree of strain relaxation and low TDD for device applications.

One conventional approach employs compositionally graded buffers, in which very thick buffers (several micrometers) are grown on a Si substrate with Ge composition increasing from the Si substrate to the buffer surface. FIG. 1A illustrates a semiconductor device including a Si substrate 101, a reverse-graded SiGe buffer layer 103, and a relaxed SiGe epitaxial layer 105. FIG. 1B shows an example of the respective atomic concentration of the Si and Ge at different depths of the semiconductor device. The reverse-graded SiGe buffer layer 103 may be grown to 100 nm to 300 nm in thickness, but requires a low temperature (e.g., 400° C.), which is difficult to implement practically, because there is no appreciable Si growth using normal Si hydride sources such as $SiH_4$ and $Si_2H_6$ at that temperature for standard chemical vapor deposition (CVD) epitaxial reactors.

Another conventional approach involves the growth of a thin SiGe layer on top of alternating SiGe/SiGeC buffer layers. FIG. 2 illustrates a semiconductor device including a Si substrate 201, a SiGeC layer 203, SiGe layer 205, a SiGeC layer 207, SiGe layer 209, and a relaxed SiGe epitaxial layer 211. According to this approach, a thin SiGe epitaxial layer 211 can be grown on Si, having a low TDD, but a SiGeC layer grown with high Ge % and high C % is challenging for volume manufacturing.

A need therefore exists for methodology enabling manufacture of a strain relaxed epitaxial SiGe layer with a high strain relaxation degree, a low TDD, and a reduced layer thickness that is viable for volume production, and the resulting semiconductor devices.

SUMMARY

An aspect of the present disclosure is a method of forming a fully relaxed silicon germanium (SiGe) epitaxial layer on a semiconductor substrate.

Another aspect of the present disclosure is a device with a fully relaxed SiGe epitaxial layer on a semiconductor substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a silicon germanium (SiGe) epitaxial layer on a semiconductor substrate, implanting a dopant into the SiGe epitaxial layer, and annealing the implanted SiGe epitaxial layer.

Aspects of the present disclosure include forming the SiGe epitaxial layer on a single crystalline silicon substrate. Further aspects include forming the SiGe epitaxial layer on a silicon-on-insulator (SOI) substrate. Another aspect includes implanting arsenic (As), germanium (Ge), or boron (B) into the SiGe epitaxial layer. Additional aspects include forming the SiGe epitaxial layer to a thickness of 20 nm to 500 nm. Further aspects include forming the SiGe epitaxial layer with 10 at. % to 100 at. % Ge. Other aspects include the annealed SiGe having a threading dislocation density less than 1 e6/cm2. Another aspect includes the annealed SiGe having a degree of strain relaxation greater than 80%. Further aspects include annealing at a temperature of 400° C. to 1350° C. Additional aspects include annealing the implanted SiGe epitaxial layer by rapid thermal anneal or furnace anneal. Another aspect includes forming the SiGe epitaxial layer on the semiconductor substrate by blanket epitaxy. Further aspects include forming the SiGe epitaxial layer on the semiconductor substrate by selective epitaxy.

Another aspect of the present disclosure is a device including: a semiconductor substrate, and a SiGe epitaxial layer, implanted with a dopant, formed on the semiconductor substrate, the implanted SiGe epitaxial layer having a degree of strain relaxation greater than 80%.

Aspects include a device including a SiGe epitaxial layer implanted with a dopant of As, Ge, or B. Further aspects include a device including a SiGe epitaxial layer having a thickness of 20 nm to 500 nm. Another aspect includes a device including a SiGe epitaxial layer having 10 at. % to near 100 at. % Ge. Additional aspects include a device including an implanted SiGe epitaxial layer having a threading dislocation density less than 1 e6/cm2.

Another aspect of the present disclosure is a method including epitaxially growing a silicon germanium (SiGe) layer to a thickness less than 500 nm on a silicon or silicon-on-insulator (SOI) substrate, the SiGe having 10 at. % to near 100 at. % Ge; implanting a dopant into the SiGe layer; and thermally annealing the implanted SiGe epitaxial layer at a temperature of 400° C. to 1350° C., the annealed SiGe layer having a threading dislocation density less than 1e6/cm2, and a degree of strain relaxation greater than 80%. Further aspects include implanting arsenic into the SiGe layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of high threading dislocation density and low strain relaxation attendant upon forming a thin SiGe epitaxial layer which may be volume produced. Attempts to grow a thin SiGe layer with greater than 30% Ge content on a thin reverse graded SiGe buffer 103 resulted in a thickness less than 300 nm, strain relaxation greater than 80%, and TDD less than 1e6/cm2. However, a Ge content greater than 40% with a smooth growth morphology, which is necessary to achieve a low TDD, is not readily manufacturable. Another attempt involved growing a SiGe layer having a total thickness less than 300 nm on alternating SiGe/SiGeC buffer layers of 77% Si:23% Ge and 76% Si:23% Ge:1% C. Although this resulted in a TDD down to 1e4/cm2, a SiGeC layer grown with high Ge % and high C % is challenging for volume manufacturing. In accordance with embodiments of the present disclosure, a heavy dopant is implanted in the SiGe epitaxial layer, and the layer is then annealed. As a result, a thin SiGe epitaxial layer may be formed with a high strain relaxation and low TDD and may be volume produced.

Methodology in accordance with embodiments of the present disclosure includes forming a silicon germanium (SiGe) epitaxial layer on a semiconductor substrate, implanting a dopant into the SiGe epitaxial layer, and annealing the implanted SiGe epitaxial layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
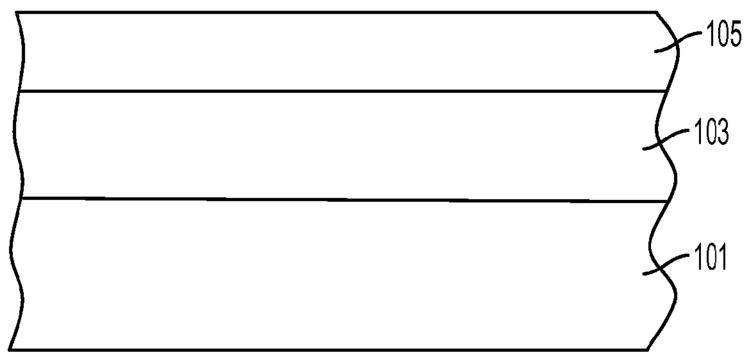
FIGS. 1A and 1B schematically illustrate a conventional semiconductor device and the atomic concentration of Si and Ge through the device, respectively.
Figure 1B:
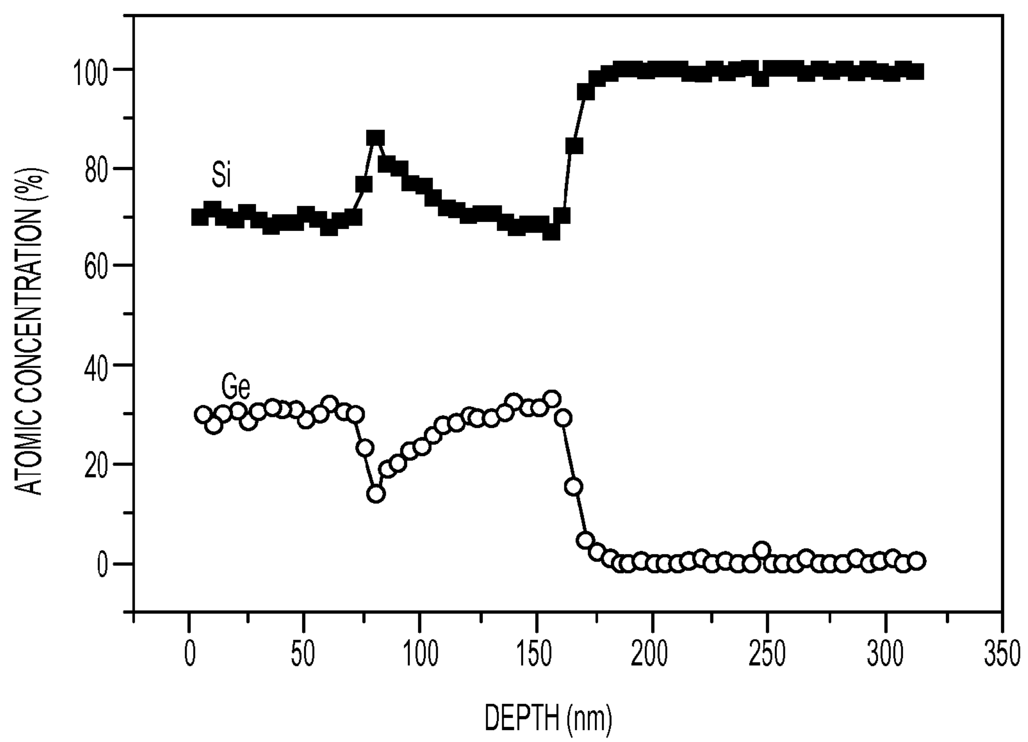
Figure 2:
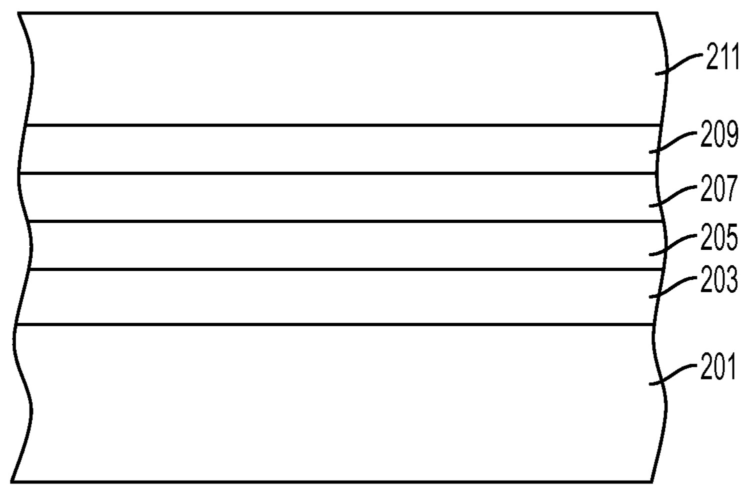
FIG. 2 schematically illustrates another conventional semiconductor device.
Figure 3A:
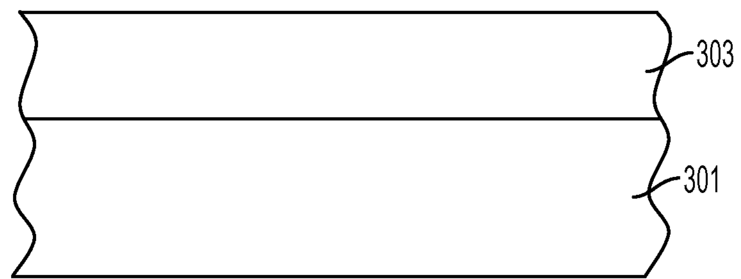
FIGS. 3A through 3C schematically illustrate a process flow for forming a semiconductor device, in accordance with an exemplary embodiment.
Figure 3B:
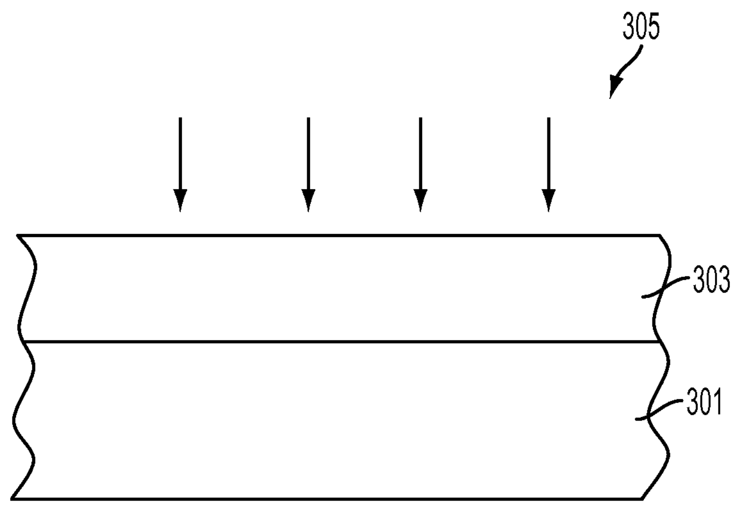
Figure 3C:
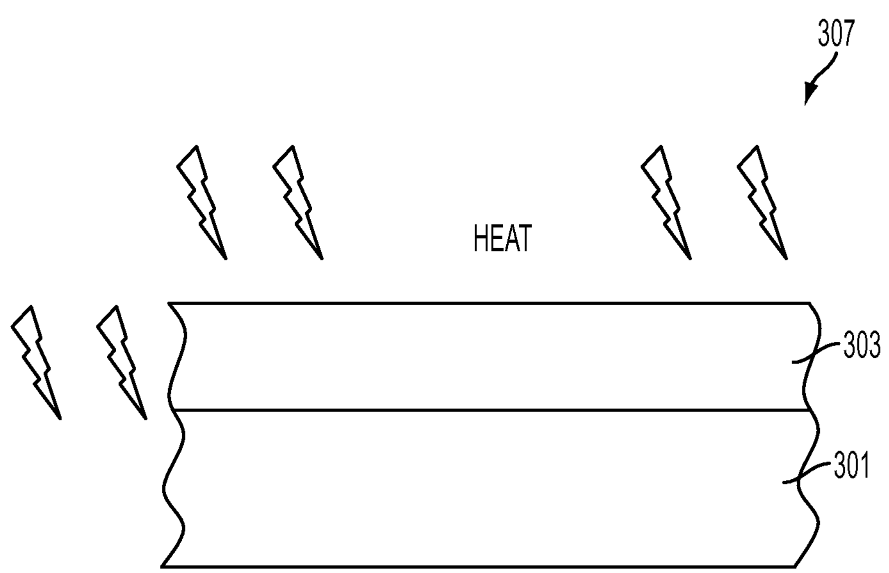

Adverting to FIGS. 3A through 3C, a process flow for forming a semiconductor device, in accordance with an exemplary embodiment, is illustrated. The semiconductor device is formed with a fully relaxed SiGe epitaxial layer on a silicon substrate. As illustrated in FIG. 3A, a SiGe epitaxial layer 303 is formed on a semiconductor substrate 301. SiGe epitaxial layer 303 is epitaxially grown in situ on semiconductor substrate 301 to a thickness of 20 nm to 500 nm, for example by molecular beam epitaxy (MBE), or low pressure chemical vapor deposition (LPCVD) procedures, at a temperature of 200° C. to 900° C., using silane or disilane or any other silicon containing source as a silicon source and using germane, or other germanium containing source, as a germanium source. Substrate 301 may be a single crystalline silicon substrate or a silicon-on-insulator (SOI) substrate. SiGe epitaxial layer 303 may be formed on the semiconductor substrate 301 by blanket epitaxy or selective epitaxy.

As illustrated in FIG. 3B, SiGe epitaxial layer 303 is subsequently ion implanted with a dopant 305, for example arsenic (As), germanium (Ge), or boron (B), or other types of atoms with optimized implant and anneal conditions. For example, As atoms may be implanted with an incident energy of 5 keV to 50 keV, e.g., 20 keV to 40 keV, and a dosage of 1e11/cm2 to 1e14/cm2, e.g., 1 e13/cm2, whereas B may be implanted with an incident energy of 1 keV to 2 keV, and a dosage of 1e15/cm2 to 2e15/cm2.

An anneal procedure is then performed with heat 307, as illustrated in FIG. 3C, resulting in a relaxed SiGe epitaxial layer 303. The implanted SiGe epitaxial layer may be annealed by rapid thermal anneal or furnace anneal, at temperatures of 400° C. to 1350° C. The resultant relaxed SiGe epitaxial layer 303 may include up to 40 at. % of Ge, may exhibit 100% strain relaxation and a TDD smaller than 1e5/cm2, while having a thickness smaller than 100 nm. Alternatively, the resultant relaxed SiGe epitaxial layer 303 may have up to 20 at. % of Ge, with 100% strain relaxation, and a TDD smaller than 1e4/cm2, for a thickness smaller than 100 nm.

The embodiments of the present disclosure can achieve several technical effects, including increasing Ge content in a SiGe epitaxial layer to obtain a higher strain relaxation and lower TDD without increasing the thickness of the layer. The present disclosure enjoys industrial applicability in any of various types of highly integrated semiconductor devices, including a complementary metal-oxide-semiconductor (CMOS) structure or an optoelectronic detector.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:

forming a silicon germanium (SiGe) epitaxial layer having a thickness less than 200 nm on a semiconductor substrate;

ion implanting a dopant into the SiGe epitaxial layer; and annealing the implanted SiGe epitaxial layer at a temperature of 400° C. to 1350° C., wherein the annealed SiGe has a threading dislocation density less than 1e6/cm2, and wherein the annealed SiGe has a degree of strain relaxation greater than 90%.

2. The method according to claim 1, comprising forming the SiGe epitaxial layer on a single crystalline silicon substrate.

3. The method according to claim 1, comprising forming the SiGe epitaxial layer on a silicon-on-insulator (SOI) substrate.

4. The method according to claim 1, comprising implanting arsenic (As), germanium (Ge), or boron (B) into the SiGe epitaxial layer.

5. The method according to claim 1, comprising forming the SiGe epitaxial layer with 10 atomic % to near 100 atomic % Ge.

6. The method according to claim 1, comprising annealing the implanted SiGe epitaxial layer by rapid thermal anneal or a furnace anneal.

7. The method according to claim 1, comprising forming the SiGe epitaxial layer on the semiconductor substrate by blanket epitaxy.

8. The method according to claim 1, comprising forming the SiGe epitaxial layer on the semiconductor substrate by selective epitaxy.

9. A device comprising:

a semiconductor substrate; and a SiGe epitaxial layer having a thickness less than 200 nm, implanted with a dopant, formed on the semiconductor substrate, wherein the implanted SiGe epitaxial layer has a degree of strain relaxation greater than 90% and wherein the implanted SiGe epitaxial layer has a threading dislocation density less than 1e6/cm2.

10. The device according to claim 9, wherein the dopant comprises As, Ge, or B.

11. The device according to claim 9, wherein the SiGe epitaxial layer comprises 10 atomic % to near 100 atomic % Ge.

12. A method comprising:

epitaxially growing asilicon germanium (SiGe) layer to a thickness less than 100 nm on a silicon or silicon-on-insulator (SOI) substrate, the SiGe having 10 atomic % to near 100 atomic % Ge;

ion implanting a dopant at a dose of 1E11/cm2 to 2E15/cm2 into the SiGe layer; and thermally annealing the implanted SiGe epitaxial layer at a temperature of 400° C. to 1350° C., wherein the annealed SiGe layer has a threading dislocation density less than 1e6/cm2, and a degree of strain relaxation greater than 90%.

13. The method according to claim 12, comprising implanting arsenic (As) into the SiGe layer.

14. The method according to claim 12, comprising implanting germanium (Ge) into the SiGe layer.

* * * * *